United States Patent [19]
Lewis

[11] 4,078,210
[45] Mar. 7, 1978

[54] MULTI-MODED ACOUSTIC WAVE OSCILLATOR

[75] Inventor: Meirion Francis Lewis, Malvern, England

[73] Assignee: National Research Development Corporation, London, England

[21] Appl. No.: 674,875

[22] Filed: Apr. 8, 1976

[30] Foreign Application Priority Data

Apr. 10, 1975 United Kingdom ............... 14862/75

[51] Int. Cl.² .............................................. H03B 5/30
[52] U.S. Cl. ................................ 331/107 A; 310/366; 331/135; 331/179; 333/30 R; 333/72
[58] Field of Search ................... 331/107 A, 135, 179; 333/30 R, 72; 310/9.8

[56] References Cited

U.S. PATENT DOCUMENTS

| 3,582,540 | 6/1971 | Adler et al. | 331/107 A X |
| 3,852,681 | 12/1974 | Underhill | 331/1 R |
| 3,921,093 | 11/1975 | Lewis | 331/107 A X |
| 3,962,652 | 6/1976 | Zarin et al. | 331/107 A X |

OTHER PUBLICATIONS

Morgan et al., "Non-Uniform Interdigital Transducers for Acoustic Surface Waves," NEC Research & Development, No. 28, Jan. 1973, pp. 1–13, (333-30 R).

Primary Examiner—Siegfried H. Grimm
Attorney, Agent, or Firm—Cushman, Darby & Cushman

[57] ABSTRACT

A multi-moded acoustic wave oscillator comprises an amplifier and feedback loop incorporating an acoustic wave delay line which may be a surface acoustic wave delay or bulk acoustic delay. Frequency of oscillation is changed in steps by taking different phased outputs from the delay line. This phase difference is achieved either by spacing surface acoustic wave transducers different distances on a substrate from an input transducer or by phase shift circuitry.

Figure 4:
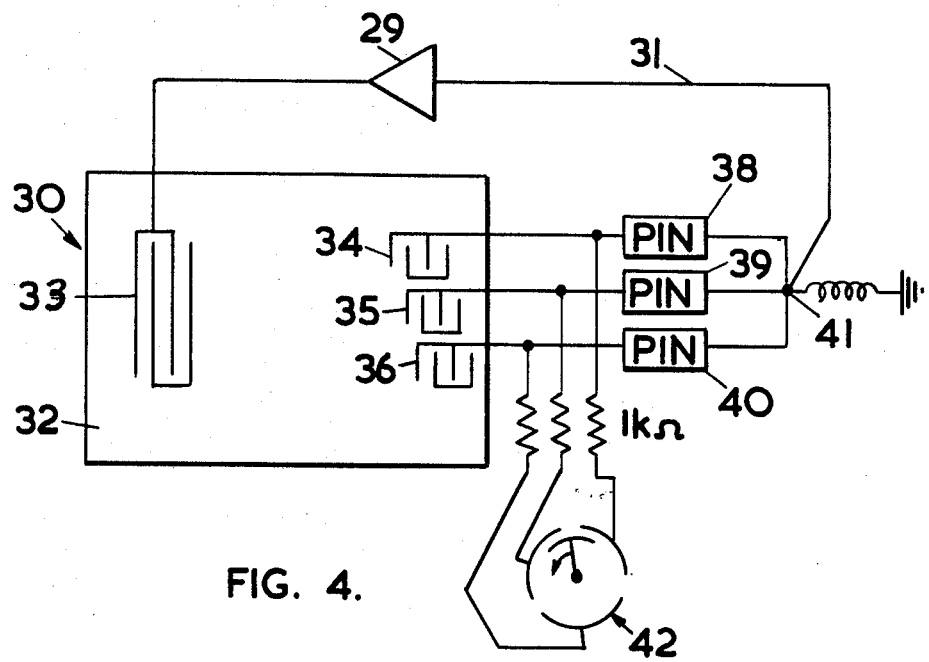

9 Claims, 6 Drawing Figures 4,078,208

LINEAR AMPLIFIER CIRCUIT WITH INTEGRATED CURRENT INJECTOR

REFERENCE TO RELATED APPLICATIONS

This is a division of application Ser. No. 505,663 filed Sept. 13, 1974, now abandoned, which was a continuation of application Ser. No. 253,348 filed May 15, 1972, now abandoned. Ser. No. 505,663 has been continued in copending application Ser. No. 674,065 filed Apr. 5, 1976. Copending application Ser. No. 653,131 filed Jan. 28, 1976 is also a division of application Ser. No. 505,663 filed Sept. 13, 1974.

The invention relates to an integrated circuit comprising several circuit elements which are arranged beside each other on one side of a body which is common to said circuit elements, semiconductor zones of said circuit elements being connected to a pattern of conductive tracks present on the said one side of the body for the electric connection of the said circuit elements, said pattern having at least one input and at least one output for electric signals, the body furthermore comprising connections for connecting the two polarities of a source for supplying bias current to one or more of the current elements.

The common body of such an integrated circuit may consist, for example, mainly of insulating material on which one or more semiconductor regions are provided or in which a number of such regions are embedded. However, the common body usually consists substantially entirely of a semiconductor material. In, and in certain cases also entirely or partly on, such a semiconductor body which usually is monocrystalline, circuit elements, for example diodes, transistors, resistors and capacities, are realized with semiconductor regions having different electric properties, p-n junctions, Schottky junctions, insulating and conductive layers, and so on, which elements are connected to form a circuit by means of a pattern of conductive tracks.

When the number of circuit elements per integrated circuit increases, a number of problems present themselves. For example, the yield in the manufacture strongly depends upon the size of the semiconductor surface area required for the circuit in that sense that when said surface area increases, the yield decreases. Furthermore, the dimensions of the circuit elements themselves influence their high-frequency behaviour. For example, the cut-off frequency generally is smaller according as the dimensions of the relevant circuit element are larger. Also for these reasons it is desirable to reduce the dimensions of the semiconductor regions of the circuit elements as much as possible and to simplify the technology for the manufacture, if possible.

Another problem is the admissible dissipation. Reducing the dissipation and hence the energy consumption of the circuit, which reduction is not at the cost of the ready functioning and/or the cost-price of the integrated circuit, increases the application possibilities of such circuits. However, other criteria may also play an important part with respect to the dissipation. For example, in the case of large and complex integrated circuits the overall dissipated energy may be so large that stringent requirements are imposed upon the cooling of the common body so as to be able to keep the maximum temperature below a value at which a reliable operation of the circuit is not yet endangered. Furthermore, for example in battery-operated circuits, the desirability exists, in connection with the life of the batteries, to use circuits having a small dissipation.

The desirability of small dissipation generally leads to the use of load resistors for the transistors in the circuit which have a high resistance value. However, such high-value resistors require comparatively much semiconductor surface area as a result of which, as already described above, the yield in the manufacture is adversely influenced and/or the number of circuit elements per integrated circuit becomes relatively smaller.

Also in connection with the above-mentioned contradictory requirements it has already been proposed to replace in such integrated circuits the load resistors by complementary transistors which are provided in the common body so as to be insulated from the remaining transistors.

If in this or another manner, for example, a compromise has been found between the semiconductor surface area required for the circuit elements and the admissible dissipation, a further problem may be that when the number of circuit elements increases, a situation can be reached in which no longer the circuit elements themselves but the pattern of conductive tracks required for inter-connection and electric biasing of said circuit elements including the supply tracks is decisive or at least also decisive of the required surface area.

It is to be noted that bias currents are to include all those currents which are supplied to the circuit elements for the direct current biasing thereof. A number of these currents, usually those currents which flow through the main current path of the relevant circuit element via the main electrodes, for example the emitter and the collector of a transistor, also supply energy which may be used for signal amplification - the ratio between the energies of the output signal and the input signal. "Supply tracks" are to be understood to mean tracks which serve notably to supply the last-mentioned bias currents.

A part of the pattern of conductive tracks is formed by the connections which are necessary for the electric biasing of the circuit elements. In the operating condition, comparatively much current flows in particular through the supply tracks, in which tracks usually substantially no voltage loss may occur. As a result of this, in particular the supply tracks are often constructed to be comparatively wide in the conventional integrated circuits. Furthermore, in substantially any place in the circuit, bias currents have to be supplied to circuit elements as a result of which the relevant tracks usually have a considerable length. So the supply tracks required for the biasing of the circuit elements require a considerable part of the space available for the pattern as a result of which the realization of the remaining conductive connections within a restricted space is impeded also because crossing connections are preferably avoided. Indeed, this problem does not only occur with very large integrated circuits but also in circuits having a smaller number of circuit elements, albeit sometimes in a less serious form.

In Dutch Patent Application No. 6,800,881 laid open to public inspection on July 24, 1968, an integrated circuit is described in which conductive tracks at the surface for supplying bias current are avoided as much as possible. This integrated circuit does not have a p-type semiconductor substrate, as is usual, but an n-type semiconductor substrate. On this n-type substrate is then grown epitaxially first a p-type layer and then an n-type layer. The circuit elements are provided in the epitaxial n-type layer in the same manner as in conventional integrated circuits, the function of the p-type epitaxial layer, at least in an electric respect, being comparable to that of the conventional p-type substrate. During operation the negative polarity of the external voltage source is connected to the p-type layer and the positive polarity is connected to the n-type substrate. A direct conductive connection is provided between the n-type substrate and one or more parts of the n-type epitaxial layer in that, prior to growing the epitaxial n-type layer, the conductivity type of the p-type layer in the relevant places has been converted into n-type by diffusion. In this manner, the two polarities of the voltage source are available substantially in any desirable location at the semiconductor surface via a direct low-ohmic conductive connection. However, the manufacture of said circuits is considerably more complicated than that of the more conventional integrated circuits as a result of the extra epitaxial p-type layer and the extra diffusion treatment for the conductive corrections between the n-type substrate and the n-type epitaxial layer.

It is the object of the invention to provide new routes for the integration of circuits. It is based inter alia on the recognition of the fact that the mechanism which has long been known per se to occur in transistors and in which current can be transmitted via an intermediate layer by injecting, via a first junction, charge carriers in the intermediate layer, which carriers are collected from the intermediate layer via a second junction, can be used in a multilayer structure, termed current injector, for supplying bias current to circuit elements of an integrated circuit in a manner different from the manner hitherto known and that the current injector in relation to the circuit elements to be supplied by the current injector can be incorporated in the integrated circuit, in which either for an electric connection of the current injector the readily admissible side of the body which is common to the circuit elements and which side is present opposite to the one side where the said pattern of conductive tracks is present is used, or the current injector is combined with one or more circuit elements to be biased so that they have at least a common zone, in such manner that a considerable simplification in structure, a greater compactness, a simplified wiring pattern and even a renovation in the structure of the integrated circuits with associated technological and electrical advantages, for example separation of the supply inputs from the signal inputs, become possible.

According to the invention, an important characteristic feature of integrated circuits of the type described in the preamble is that the common body comprises a current injector for supplying bias current, said current injector being a multilayer structure having at least three successive layers which are separated from each other by rectifying junctions among which a first layer - termed injecting layer - which is separated from the circuit elements to be adjusted by at least one rectifying junction, and an adjoining second layer of a semiconductor material - termed intermediate layer -, the injecting layer having a connection for one polarity of the said source and the intermediate layer having a connection for the other polarity of the said source to polarize the rectifying junction between the injecting layer and the intermediate layer in the forward direction, to inject charge carriers from the injecting layer into the intermediate layer which are collected by the third layer of the current injector adjoining the intermediate layer - termed collecting layer -, the said current injector being used, according to one or more of the aspects of the invention to be described hereinafter, in very close relationship with the circuit element to be biased as regards location and distance.

According to a first aspect of the invention, an integrated circuit of the type described in the preamble in which, according to the invention, a current injector is incorporated is furthermore characterized in that a zone of one of the circuit elements - termed zone to be biased - which is separated from the injecting layer and hence from the one source connection connected thereto by at least two rectifying junctions, collects, across a rectifying junction bounding said zone, charge carriers from one of the layers of the current injector and thus receives bias current, said zone being directly connected to the pattern of conductive tracks.

In this manner said current injector is combined with at least the said one circuit element to form a compact assembly in which by means of injection of charge carriers across a rectifying junction which is polarized in the forward direction and essentially does not belong to the one circuit element, a flow of charge carriers which forms the bias current required for the zone to be biased is supplied to said zone. It is of particular importance that no connection of the zones to be biased to the pattern of conductive tracks is necessary for supplying bias current. This is one of the reasons why said pattern of conductive tracks becomes simpler. Furthermore, the said electric biasing obtained by means of the current injector is in the form of supplying current, as a result of which the use of resistors becomes substantially superfluous. In addition to the bias current supplied by means of the current injector, electric signals may, if desirable, be supplied to or derived from the zone to be biased via the pattern of conductive tracks.

The zones to be biased of the circuit elements may belong to main electrodes, for example the emitter and the collector of a transistor, but they may also belong to control electrodes of the circuit elements in question.

According to a second aspect of the invention, the said current injector is combined with at least one of the circuit elements to form a particularly compact assembly. An integrated circuit according to said second aspect of the invention comprises a current injector, the zone to be biased of the one circuit element collecting charge carriers from one of the layers of the current injector as described above, and said integrated circuit being furthermore characterized in that the last-mentioned one layer of the current injector also forms a further zone of the one circuit element, the zone to be biased being directly connected to a further part of the integrated circuit, for example, the pattern of conductive tracks and/or further circuit elements.

This embodiment is particularly suitable for the electric biasing of control electrodes, for example the base zones of transistors.

According to a third aspect of the invention which, if desirable, may also be combined with the preceding aspects, the current injector is constructed to be lateral, that is to say having the layers of the current injector beside each other and adjoining the said one side of the body. In this lateral embodiment the charge carriers carrying the bias current experience a displacement in the lateral direction, so approximately parallel to one side of the body.

An integrated circuit according to said third aspect of the invention comprises a current injector as described the intermediate frequencies, e.g. in an f.m. tuner with equal channel separations.

Figure 1:
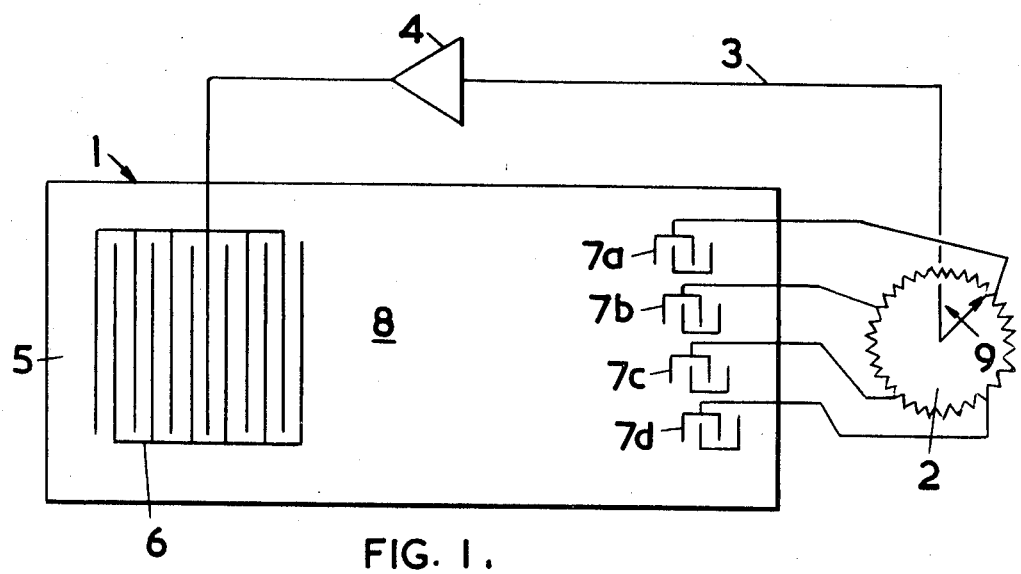

One partial solution to this problem is to modify the positions of transducers 7c and 7d in FIG. 1, so that transducers 7a and 7c are equidistant from the input transducer 6 and 7b and 7d are equidistant from the input transducer 6. Additionally the outputs from 7c and 7d are taken from the lower combs instead of the upper combs shown in FIG. 1. By so reversing the connections to 7c and 7d a phase shift of 180° is introduced which compensates for the displacement by $\lambda_o/2$ at the centre frequency. By this means the frequencies from 7a and 7d have equal separation at al frequencies, and the same is true of the frequencies frm 7b and 7c.

Figure 6:
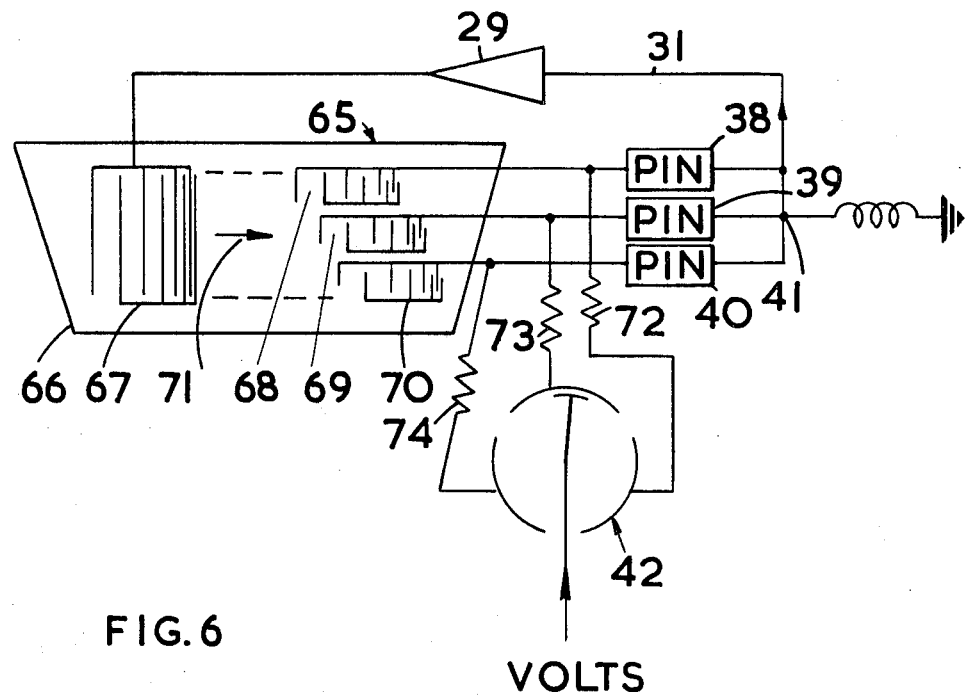

Another solution to the above problem is to modify the arrangements shown in FIGS. 1 and 4 by replacing the non-dispersive transducers shown and use dispersive transducers. This is shown in FIG. 6 which is similar in operation to FIG. 4. The device of FIG. 6 comprises an amplifier 29 with a SAW delay line 65 in the feedback loop 31. The delay line 65 comprises a quartz substrate 66 carrying a dispersive input transducer 67 and three dispersive output transducers 68 69 70 spaced $\lambda_o/3$ along a SAW track 71, each output transducer having varying finger length to provide weighting. As in FIG. 4 output from the transducers 68, 69, 70 is through PIN diodes 38, 39, 40 to a junction 41 and then to the amplifier 29. These PIN diodes are biased in turn by application of a suitable voltage through a make before break three way switch 42 and a 1 kohm resistor 72, 73, 74 to connect the output transducers 68, 69, 70, respectively in turn to the amplifier 29. The oscillator of FIG. 6 operates in the same way as the oscillator of FIG. 4.

With the dispersive transducers 67, and 68, 69, 70 shown in FIG. 6, different frequencies are effectively launched from different parts of the transducer; this is achieved by varying the interfinger spacing along the transducer. Thus, the low and high frequency ends of the input transducer 67 may be left and right ends respectively as seen in the drawing, while the low and high frequency ends of the output transducers 68, 69, 70 are also the left and right ends respectively. In these circumstances the dispersion characteristics of the input 67 and output 68, 69, 70 transducers tend to cancel each other out. It is arranged that the input transducer 67 and one output transducer, e.g., 68, have identical dispersion characteristics so that this delay line as a whole is non-dispersive and the mode spacing is $1/\gamma_a$ at all frequencies (where $\gamma_a$ is the delay time which in these circumstances is independent of frequency). However, the dispersion characteristics of 69 and 70 are successively mismatched from the input transducer 67 in such a manner that for each delay line the intermode spacing is $\Delta f \equiv 1/\gamma_a$ at all frequencies.

An additional advantage of using dispersive transducers is in their relative ease of matching to a 50Ω source for minimum insertion loss over large bandwidths. For this reason there may be occasions where five transducers of identical dispersion characteristics are used in the arrangement of FIG. 1.

The arrangement shown in FIG. 3 may also be modified to use dispersive transducers in a manner similar to that described with reference to FIG. 1.

Figure 5:
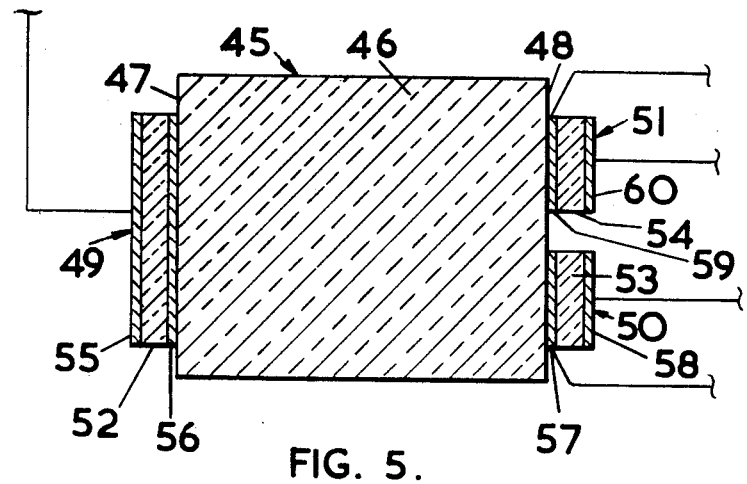
Figure 3:
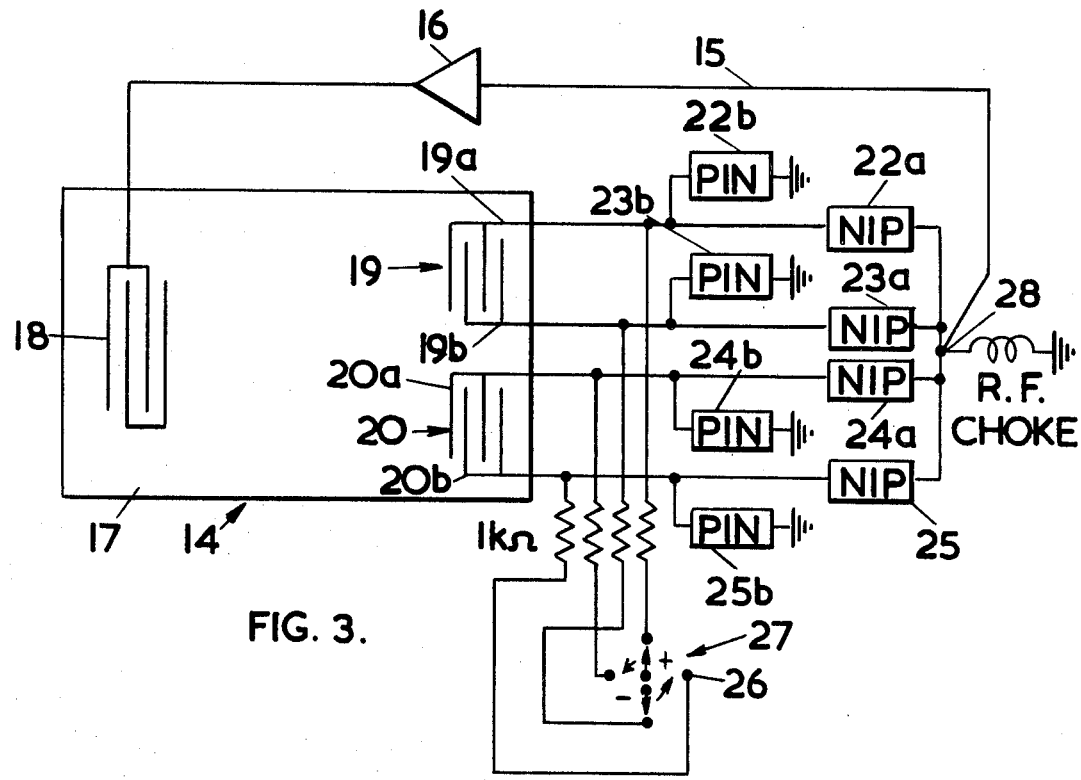

FIG. 5 shows a bulk acoustic wave (BAW) delay line 45 for use in the feedback loop of an amplifier to replace the delay line 15 of FIG. 3. It comprises an isopaustic glass block 46 with two polished flat and parallel ends 47, 48. One end 47 carries an input transducer 49 and the other end carries two output transducers 50, 51. Each transducer 49, 50, 51 comprises a quartz crystal 52, 53, 54 sandwiched between two gold sheet electrodes 55, 56, 57, 58, 59, 60. Signals from output transducers 50, 51 will be in phase; a 90° phase shift between outputs may be achieved by a $\lambda_o/2$ length of electromagnetic delay cable. Alternatively series/parallel tuning inductances may be added to one/both transducers so as to produce a phase difference between outputs.

The BAW delay line is used in the same manner as the SAW line of FIG. 3, namely to change the frequency of oscillation, output to the amplifier is changed in phase steps of 90°, by using the output transducers 50, 51 in turn and by reversing earth and live electrodes e.g. with biassed PIN diodes.

One problem with all the above oscillators is knowing the precise frequency mode the device is operating at out of the many permitted modes, e.g. after initial switch on. There are many possible solutions to this problem, four of these are as follows.

Figure 2:
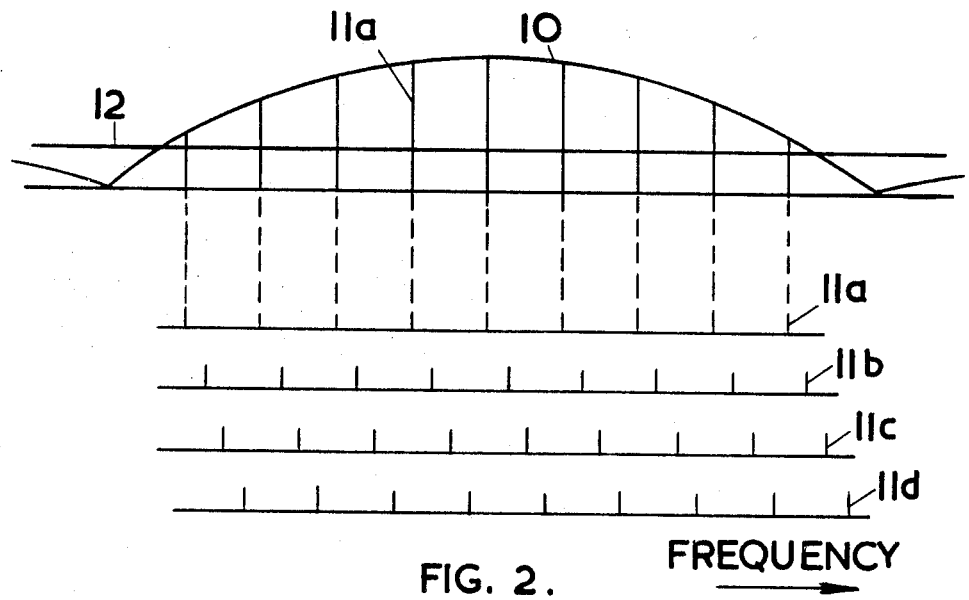

One solution is to ensure that one mode is more strongly favoured than all the others (e.g. the central mode in FIG. 2) and to switch the amplifier on slowly so that its gain gradually increases over a period of say 1 second. It is known that the build-up time of oscillation is about twenty times the acoustic delay time (typically 20 times 3μsec = 60 μsec) giving adequate time for the central lobe to build-up before the other modes are allowed.

A second solution could be as follows. Allow the device to come on at an arbitrary frequency, and then to wind the frequency up through at least the full range. By correct design it can be made to stay at the highest frequency when an attempt is made to wind it above the highest frequency i.e. rather than jump to an arbitrary frequency. Thus this procedure enables one to attain the highest allowed frequency, and all subsequent changes are referred to this (highest) frequency. Equally, the frequency could be wound down to the lowest allowed value.

A third solution is to use a SAW oscillator having a SAW delay line on the same substrate but with such oscillator having strong mode selection i.e. it operates at one frequency only. One such oscillator having strong mode selection is described in U.K. patent application 7880/73 U.S.A. patent applicaton Ser. No. 442,624 (now U.S. Pat. No. 3,950,713), and comprises (in a simple form) an input transducer whose effective length is equal to the centre to centre distance between input and output transducers. When using two delay lines on the same substrate the delay line having strong mode selection is switched on and allowed to stabilise its frequency. When the oscillator having many possible modes is then started it will oscillate at the frequency already present either because of the acoustic waves on the substrate travelling on both delay line tracks or because of electrical interconnections common to both oscillators.

A fourth solution is to incorporate a frequency discriminator into the oscillator, e.g. as described in U.K. patent application 52,237/73, U.S.A. Pat. No. 3,921,093. The voltage output from this discriminator (e.g. one or two SAW transducers) is a measure of the frequency of oscillation. A new frequency may be selected by push-buttons which generate a voltage equal to the discriminator output voltage at the desired frequency. Any difference between this push-button voltage and the discriminator output voltage causes the frequency changing mechanism to operate, until the difference is reduced to a negligible value.

What I claim is:

1. A multi moded acoustic wave oscillator comprising an amplifier and a feedback loop connecting between the amplifier input and output and incorporating an acoustic delay line, said delay line comprising a substrate able to support acoustic waves, an interdigital finger comb input transducer for launching acoustic waves along a track in the substrate, a plurality of interdigital finger comb output transducers arranged on one side of the input transducer with each output transducer across a different part of the track at a different distance from the input transducer and each being capable of supporting oscillation at a number of harmonic frequencies, said difference in distance being less than one half wavelength at the transducer centre frequency, and switching means for cyclically connecting each output transducer in turn to the amplifier so that by sequential operation of said switching means, the oscillator may be caused to oscillate at any one of said harmonic frequencies, such number being much greater than the number of output transducers.

2. An oscillator according to claim 1 wherein the switching means comprises a plurality of solid state electrically controlled switches.

3. An oscillator according to claim 1 and comprising two output transducers spaced a quarter of the centre frequency wavelength apart on the track with both combs in both transducers connected to the amplifier through the switching means.

4. An oscillator according to claim 1 and comprising four output transducers spaced along the track so that their outputs to the amplifier are spaced apart in phase by about $\pi/2$.

5. An oscillator according to claim 1 and comprising three output transducer spaced a third of the centre frequency wavelength apart along the track.

6. An oscillator according to claim 1 wherein the transducers are non-dispersive.

7. An oscillator according to claim 1 wherein at least one of the transducers is dispersive.

8. An oscillator according to claim 1 wherein the length of the fingers within at least one of the transducers varies along the length of the transducer.

9. A multi moded acoustic wave oscillator comprising an amplifier, and a feedback loop connecting between the amplifier input and output, and incorporating an acoustic delay line, said delay line comprising a substrate able to support acoustic waves, transducer means for launching acoustic waves along a track in the substrate, transducer means for receiving acoustic waves from the track, one of the transducer means comprising a single dispersive interdigital finger comb transducer while the other transducer means comprises a plurality of dispersive interdigital finger comb transducers each arranged across a different part of the track at a different distance from said single transducer and each being capable of supporting oscillation at a number of harmonic frequencies, said difference in distance being less than one wavelength at the transducers' centre frequency, the dispersion characteristics of the single transducer and at least one of the plurality of transducers being matched so that the delay line formed by the two matched transducers is non-dispersive and the frequency difference between frequency modes is substantially constant, and switching means for connecting each one of the plurality of transducers in turn to the amplifier, so that the oscillator may be caused to oscillate at any one of said harmonic frequencies, such number being much greater than the number of said plurality of transducers.

* * * * *